(12) United States Patent
Lin

(10) Patent No.: US 11,503,739 B2
(45) Date of Patent: Nov. 15, 2022

(54) ELECTRONIC APPARATUS WITH COOLING SYSTEM

(71) Applicant: Nanning FuLian FuGui Precision Industrial Co., Ltd., Nanning (CN)

(72) Inventor: Chih-Hsuan Lin, New Taipei (TW)

(73) Assignee: Nanning FuLian FuGui Precision Industrial Co., Ltd., Nanning (CN)

( * ) Notice: Subject to any disclaimer, the term of this patent is extended or adjusted under 35 U.S.C. 154(b) by 65 days.

(21) Appl. No.: 17/205,095

(22) Filed: Mar. 18, 2021

(65) Prior Publication Data

US 2022/0304190 A1 Sep. 22, 2022

(51) Int. Cl.
*H05K 7/20* (2006.01)

(52) U.S. Cl.
CPC ..... *H05K 7/20272* (2013.01); *H05K 7/20781* (2013.01)

(58) Field of Classification Search
None
See application file for complete search history.

(56) References Cited

U.S. PATENT DOCUMENTS

| | | | |
|---|---|---|---|
| 6,393,853 B1 | 5/2002 | Vukovic et al. | |
| 7,318,322 B2 * | 1/2008 | Ota | H05K 7/20781 62/305 |
| 7,551,438 B2 * | 6/2009 | Seki | H05K 7/20772 165/80.4 |
| 8,270,164 B2 * | 9/2012 | Tang | H05K 7/20772 165/185 |
| 9,086,859 B2 * | 7/2015 | Attlesey | F28D 1/0206 |
| 9,265,181 B2 * | 2/2016 | Tang | H05K 7/20781 |
| 9,913,403 B2 * | 3/2018 | Krug, Jr. | H05K 7/20781 |
| 2016/0363967 A1 | 12/2016 | Tsai | |

FOREIGN PATENT DOCUMENTS

| | | |
|---|---|---|
| CN | 202453800 U | 9/2012 |
| CN | 108121423 A | 6/2018 |
| CN | 109947225 B | 7/2020 |
| TW | 595758 U | 6/2004 |
| TW | M244511 U | 9/2004 |
| TW | I598561 B | 9/2017 |

\* cited by examiner

*Primary Examiner* — Courtney L Smith
(74) *Attorney, Agent, or Firm* — ScienBiziP, P.C.

(57) ABSTRACT

An electronic apparatus with a cooling system includes a chassis having a mounting slot; a heat exchanger disposed in the chassis; a removable device is disposed in the mounting slot, and includes a housing and a first pump disposed in the housing; a tube is connected to the heat exchanger and the first pump and a sliding mechanism is disposed in the chassis, and connected to the tube. When the removable device is moved to a mounting location, the tube drives the sliding mechanism to a storage location. When the removable device is moved to a detachable location, the tube drives the sliding mechanism to an extension location, wherein the extension location is closer to the mounting slot than the storage location.

12 Claims, 4 Drawing Sheets

ELECTRONIC APPARATUS WITH COOLING SYSTEM

FIELD

The present disclosure generally relates to an electronic apparatus, specifically an electronic apparatus with a cooling system.

BACKGROUND

Servers process large amounts of data, and accordingly, a large amount of heat is generated when the server is operating. Such server has extremely high requirements for heat dissipation.

A conventional server can use multiple fans installed in the chassis to use air flow to dissipate heat. However, when the server is upgraded for higher performance, the original air-cooled cooler may not meet the new demand of heat dissipation. Therefore, improving the heat dissipation performance of such a server can be problematic.

BRIEF DESCRIPTION OF THE DRAWINGS

Many aspects of the present disclosure are better understood with reference to the following drawings. The components in the drawings are not necessarily drawn to scale, the emphasis instead being placed upon clearly illustrating the principles of the present disclosure. It will be appreciated that for simplicity and clarity of illustration, where appropriate, reference numerals have been repeated among the different figures to indicate corresponding or analogous elements.

DETAILED DESCRIPTION

Figure 1:
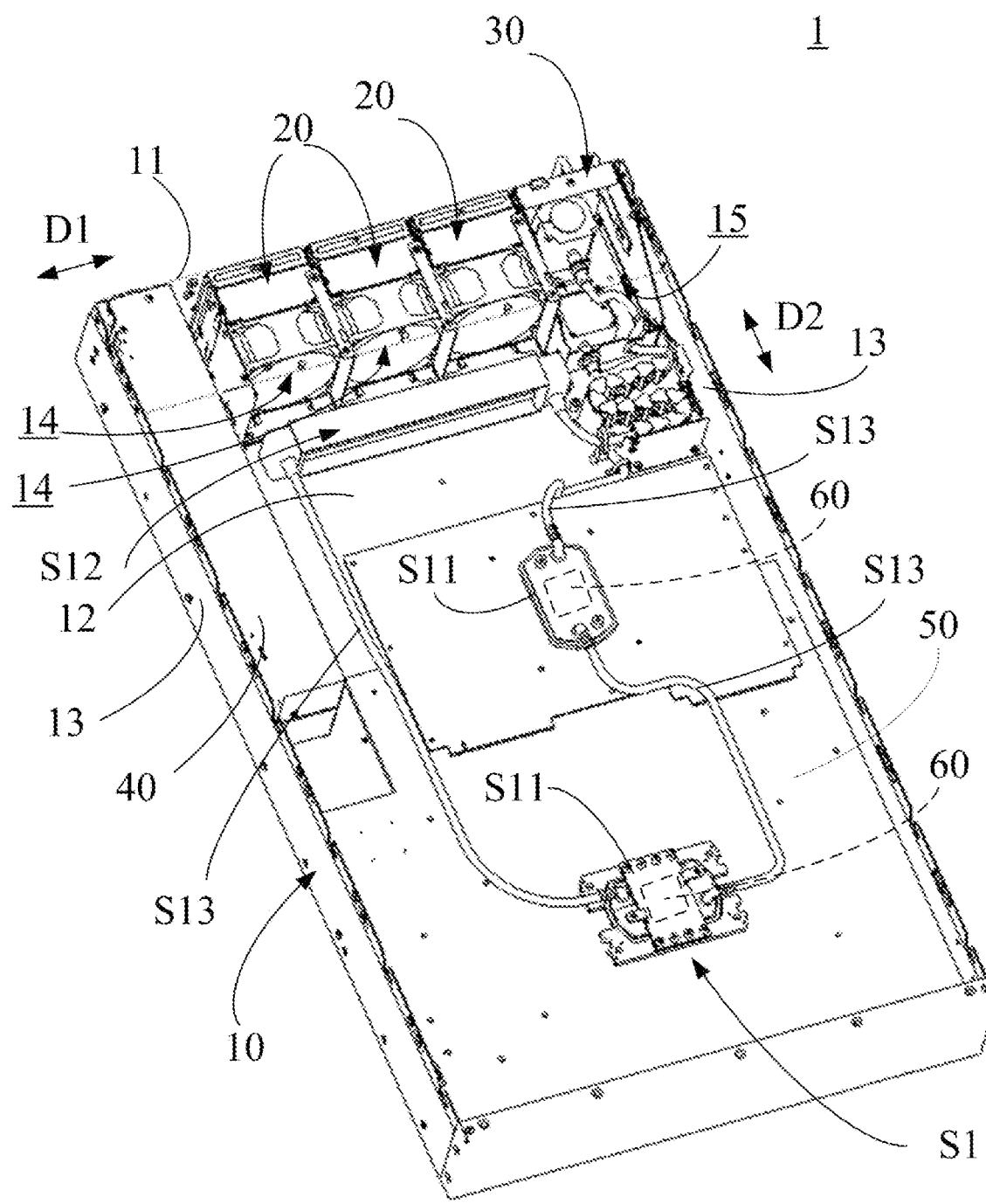
FIG. 1 is a perspective view of an electronic apparatus with a cooling system in accordance with an embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

The disclosure is illustrated by way of embodiments and not by way of limitation in the figures of the accompanying drawings, in which like references indicate similar elements. It should be noted that references to "an" or "one" embodiment in this disclosure are not necessarily to the same embodiment, and such references mean "at least one."

The term "connected" is defined as directly or indirectly through intervening components, and is not necessarily limited to physical connections. The connection can be such that the objects are permanently connected or releasably connected. The term "comprising," when utilized, means "including, but not necessarily limited to"; it specifically indicates open-ended inclusion or membership in the so-described combination, group, series, and the like.

FIG. 1 shows an electronic apparatus 1 with a cooling system S1 in accordance with an embodiment of the present disclosure. The electronic apparatus 1 may be a server, a network switch, or a personal computer. The electronic apparatus 1 includes a cooling system S1, and uses the cooling system S1 for heat dissipation.

Figure 2:
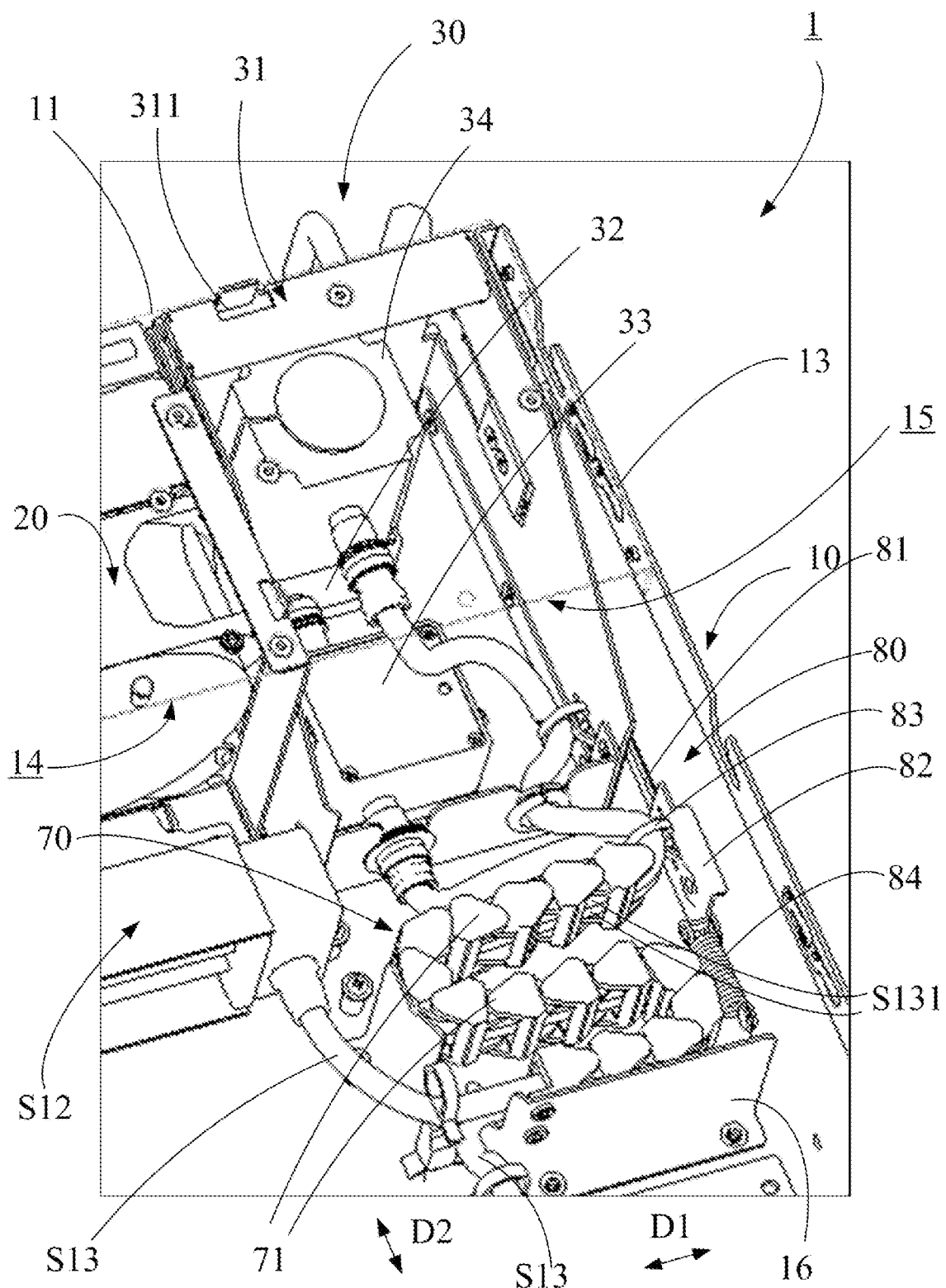
FIG. 2 is an enlarged view of part of the electronic apparatus of FIG. 1.
Figure 3:
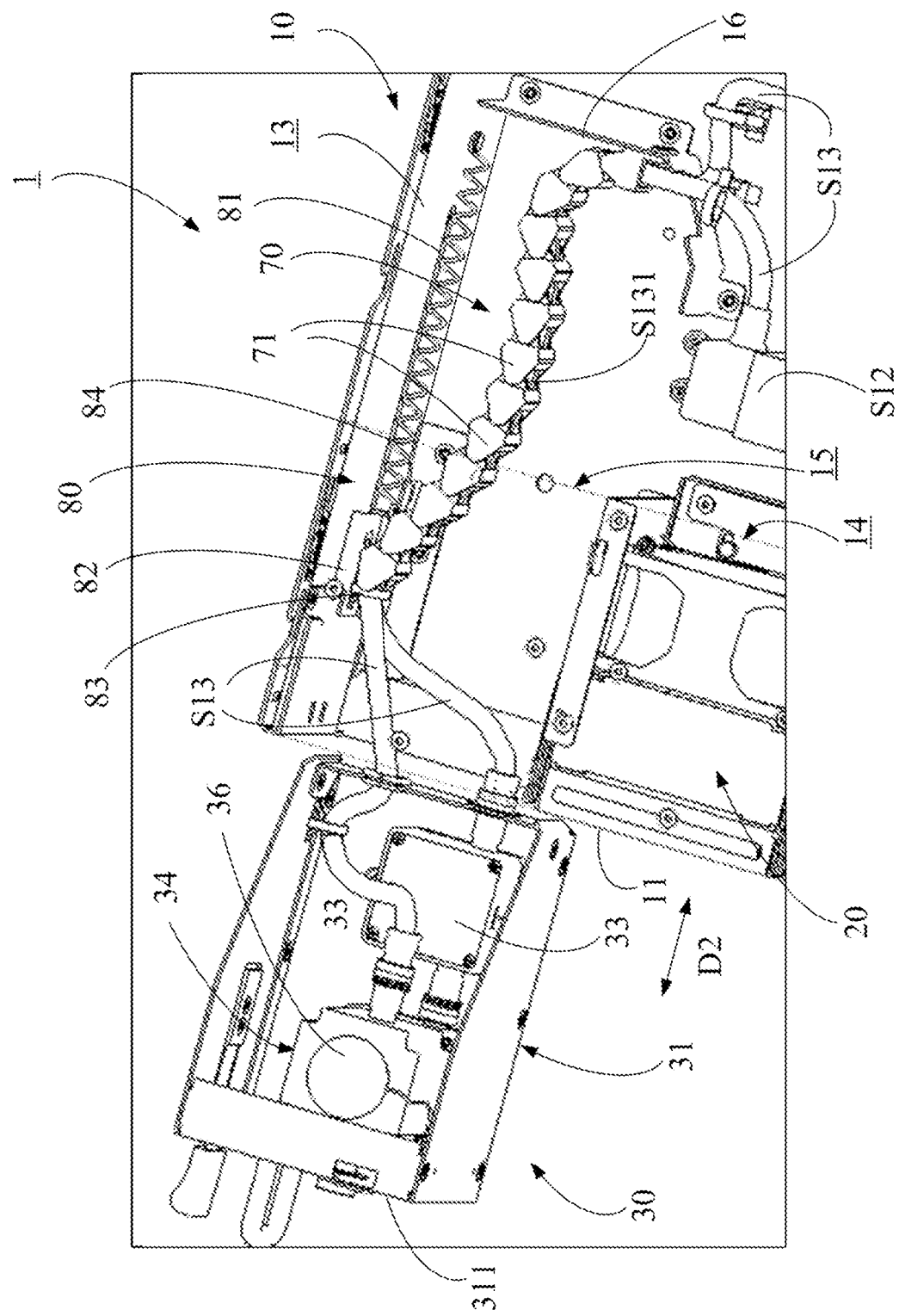
FIG. 3 is a view of part of the electronic apparatus in accordance with an embodiment of the present disclosure.

FIG. 2 is a view of part of the electronic apparatus of FIG. 1 enlarged. FIG. 3 is a view of part of the electronic apparatus in accordance with an embodiment of the present disclosure. The electronic apparatus 1 includes a chassis 10, fan devices 20, removable device 30, a power supply 40, a main board 50, and heat sources 60. In FIG. 1 to FIG. 3, for the purpose of clarity, the top cover of the chassis 10 is removed. The chassis 10 includes a heat-dissipation wall 11, a bottom plate 12, two side walls 13, fan slots 14, and a mounting slot 15. The heat-dissipation wall 11 extends perpendicularly to the bottom plate 12, and can extend in an arrangement direction D1. Two side walls 13 extend perpendicular to the bottom plate 12, and are parallel to each other. Moreover, the side walls 13 are connected to two ends of the heat-dissipation wall 11. The side walls 13 are perpendicular to the heat-dissipation wall 11 and/or extend in a movement direction D2. The heat-dissipation wall 11 and the side wall 13 are connected to the edges of the bottom plate 12. The movement direction D2 is perpendicular to the arrangement direction D1.

The fan slots 14 and the mounting slot 15 pass through the heat-dissipation wall 11. The fan slots 14 and the mounting slot 15 are arranged in the arrangement direction D1. In the embodiment, the housing 31 has three fan slots 14, the number of the fan slots 14 is not limited thereto. In the embodiment, the mounting slot 15 is connected to one of the side walls 13. In some embodiments, the mounting slot 15 is between two fan slots 14.

The fan devices 20 are detachably disposed in the fan slots 14. In the embodiment, the structure and size of the mounting slot 15 are matched to the fan slots 14, and thus the fan device 20 can be detachably disposed in the mounting slot 15. When the cooling system S1 is detached from the electronic apparatus 1, another fan device 20 can be mounted in the mounting slot 15, so that the heat dissipation system of the electronic apparatus 1 is easily upgraded and modified.

The removable device 30 is detachably disposed in the mounting slot 15. In the embodiment, the removable device 30 can be installed or removed along the movement direction D2 in the mounting slot 15. Since the structure and size of the mounting slot 15 are matched to the fan slots 14, the removable device 30 can be applied to the fan slot of an existing electronic apparatus, thereby reducing the manufacturing cost of the electronic apparatus 1.

The power supply 40 is disposed in the chassis 10, and may pass through the heat-dissipation wall 11. The power supply 40, the fan devices 20, and the removable device 30 can be arranged in the arrangement direction D1. In the embodiment, the fan device 20 is between the power supply 40 and the removable device 30. However, the order of placement of the power supply 40, the fan device 20 and the removable device 30 in the arrangement direction D1 can be changed as needed.

The main board 50 is disposed in the chassis 10, and can be affixed to the bottom plate 12. The main board 50 is between two side walls 13, and adjacent to one of the side walls 13. The heat sources 60 are in the chassis 10, and disposed on the main board 50. In the embodiment, each of the heat sources 60 can be a central processing unit (CPU), a memory, or a controller chip, but it is not limited thereto.

The cooling system S1 includes cooling elements S11, a heat exchanger S12, and a tube S13. The cooling element S11 is disposed on the heat source 60, and the cooling element S11 filled with the cooling liquid. For example, the cooling liquid can include water, propylene glycol, and/or ethanol, but it is not limited thereto. The heat exchanger S12 is disposed in the chassis 10, and affixed to the bottom plate 12. The heat exchanger S12 is filled with the cooling liquid. In the embodiment, the heat exchanger S12 may be an elongated plate structure extending in the arrangement direction D1. The heat exchanger S12 is adjacent to the fan devices 20.

The tube S13 is connected to the cooling element S11 and the heat exchanger S12, and the tube S13 is filled with the cooling liquid. The heat generated by the heat source 60 is transmitted to the cooling element S11, and then transmitted to the cooling liquid in the cooling element S11. The cooling liquid heated by the cooling element S11 is transmitted into the heat exchanger S12 via the tube S13, and thus the heated cooling liquid transmits the heat to the heat exchanger S12. When the fan device 20 is operated, air flow is generated. The air flow can pass through the fins in the heat exchanger S12 (not shown), and take away the heat of the heat exchanger S12, thereby reducing the temperature of the cooling liquid.

When the fan devices 20 generate air flow, the air flow passes through the fins (not shown in figures) inside the heat exchanger S12, and takes away the heat of the heat exchanger S12, thereby reducing the temperature of the cooling liquid.

Figure 4:
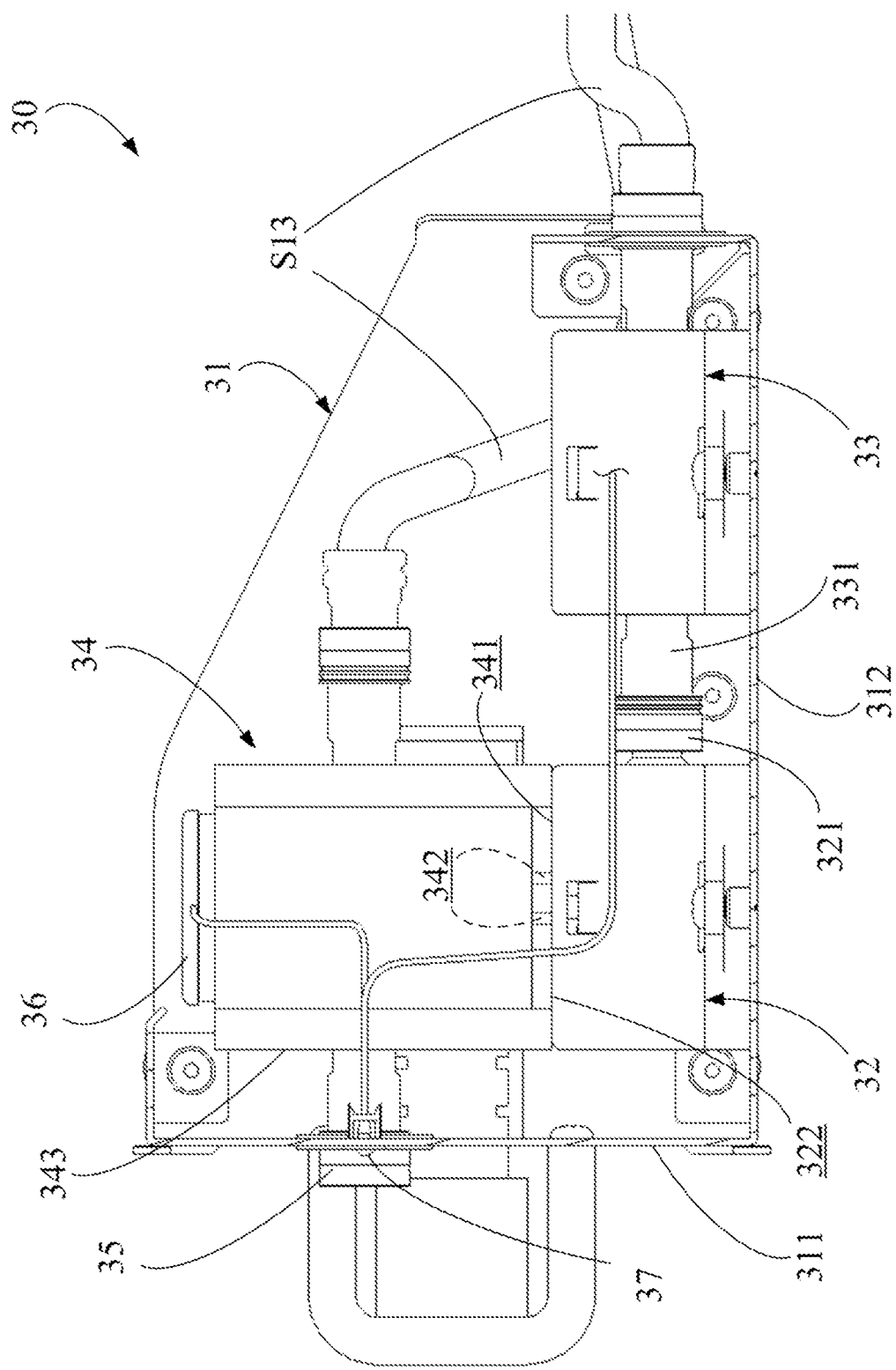
FIG. 4 is a schematic view of a removable device of the electronic apparatus in accordance with an embodiment of the present disclosure.

FIG. 4 shows the removable device 30 in accordance with an embodiment of the present disclosure. The removable device 30 includes a housing 31, a first pump 32, a second pump 33, and a tank 34. The tube S13 is connected to the tank 34 and the second pump 33, and the first pump 32 is connected to the tube S13 via the second pump 33. In some embodiments, the removable device 30 does not include the second pump 33, and the first pump 32 is directly connected to the tube S13.

The first pump 32, the second pump 33, and the tank 34 can be included in the cooling system S1 of FIG. 1. The cooling liquid cooled by the heat exchanger S12 is transmitted to the tank 34 via the tube S13. When the first pump 32 and/or the second pump 33 is operated, the cooling liquid flows into the first pump 32 and the second pump 33 via the tank 34. Finally, the cooled cooling liquid is pressured by the first pump 32 and/or the second pump 33, and flows into the cooling element S11 via the tube S13, thereby cooling the heat sources 60. The heated cooling liquid is cooled in the heat exchanger S12, and a cooling cycle is completed.

As shown in FIG. 2 and FIG. 4, the housing 31 can be moved in the mounting slot 15 in the movement direction D2. When the removable device 30 is at a mounting location as shown in FIG. 2, the removable device 30 is in the mounting slot 15, and the housing 31 is retained in the mounting slot 153. The outer wall 311 of the housing 31 may be at or adjacent to the opening of the mounting slot 15 in the heat-dissipation wall 11. When the removable device 30 is at a detachable location as shown in FIG. 3, the outer wall 311 of the housing 31 is located at the outside of the chassis 10, and far from the mounting slot 15.

As shown in FIG. 4, the first pump 32 is disposed in the housing 31, and is detachably affixed to the bottom wall 312 of the housing 31. In the embodiment, the bottom wall 312 extends in the movement direction D2, and the outer wall 311 is perpendicular to the bottom wall 312. The second pump 33 is connected to the first pump 32 and the tube S13, and is detachably affixed to the bottom wall 312 of the housing 31. In the embodiment, the first pump 32 includes a first joint 321, and the second pump 33 includes a second joint 331. The first joint 321 is detachably connected to the second joint 331. In other words, the first pump 32 can be directly connected to the second pump 33 via the first joint 321 and the second joint 331.

The first pump 32 and the second pump 33 increase the capacity and performance of the cooling system S1, by providing greater pressure for the cooling liquid, which in turn can increase the flow rate of the cooling liquid in the tube S13. Moreover, when one of the first pump 32 or the second pump 33 is damaged, the remaining first pump 32 or second pump 33 can still provide pressure on the cooling liquid to maintain the operation of the cooling system S1.

The tank 34 is disposed on the first pump 32. The tank 34 is configured to store the cooling liquid. When the first pump 32 is operated, the cooling liquid in the tank 34 flows into the first pump 32. In the embodiment, the tank 34 may be directly connected to the first pump 32, and the bottom surface 341 of the tank 34 can be attached to the top surface 322 of first pump 32. The tank 34 has one or more through holes 342 formed in the bottom surface 341. The cooling liquid in the tank 34 can directly flow into the first pump 32 through the through holes 342 by gravity, thereby increasing the efficiency of the cooling system S1.

In the embodiment, the removable device 30 further includes an input joint 35 and a sensor 36. The input joint 35 is disposed on the outer wall 311 of the housing 31, and connected to the side wall 343 of the tank 34. The cooling liquid can be injected into the tanks through the input joint 35. Since the input joint 35 is disposed on the outer wall 311 of the removable device 30, the user does not need to disassemble the removable device 30 or the electronic apparatus 1 to add the cooling liquid to the tank 34, which increases the convenience of adding to the cooling liquid.

The sensor 36 is disposed on the tank 34. The sensor 36 is configured to detect the liquid level of the cooling liquid in the tank 34. In the embodiment, the sensor 36 may be an ultrasonic sensor. The sensor 36 is configured to emit ultrasound to liquid level of the cooling liquid, and receives the ultrasound reflected by the liquid level of the cooling liquid, so as to detect the liquid level of the cooling liquid. When the sensor 36 detects that the liquid level of the cooling liquid is lower than the height of the input joint 35, the sensor 36 transmits a signal to the electronic apparatus 1, so as to remind the user to replenish the cooling liquid.

In the embodiment, the removable device 30 further includes a warning light 37 disposed on the outer wall 311 of the housing 31. The warning light 37 is electrically connected to the sensor 36 and the electronic apparatus 1. The warning light 37 emits a warning light according to the warning signal.

As shown in FIGS. 2 and 3, the housing 31 further includes a blocking element 16 and a sliding mechanism 80. The blocking element 16 is perpendicular to the movement direction D2. An access area is formed between the blocking element 16 and the mounting slot 15. Two curved sections S131 of the tube S13 are in the access area. The electronic apparatus 1 further includes a flexible tube 70 covering two curved sections S131 of the tube S13. The blocking element 16 is adjacent to the flexible tube 70, and the flexible tube 70 is between the blocking element 16 and the removable device 30. The flexible tube 70 includes connection elements 71. Each connection element 71 is pivoted on the other connection element 71. The flexible tube 70 can be bent in one plane, and each connection element 71 can be rotated in the same plane. In other words, the flexible tube 70 limits the movement of the curved section S131 in the plane. The plane may extend in the movement direction D2 and/or the arrangement direction D1.

The sliding mechanism 80 is disposed in the chassis 10, and connected to the tube S13. In the embodiment, the sliding mechanism 80 is in the access area, and adjacent to the mounting slot 15 and the blocking element 16. Moreover, the sliding mechanism 80 can be moved in the movement direction D2. The sliding mechanism 80 includes a track 81, a slider 82, a strap 83, and a spring 84. The track 81 is disposed on a side of one side wall 13 of the chassis 10, and extends in the movement direction D2. In the embodiment, the track 81 and the chassis 10 are formed as a single structure.

The slider 82 is moveably disposed on the track 81. The slider 82 can move relative to the track 81 in the movement direction D2. In other words, the slider 82 can be moved in the access area in the movement direction D2. The strap 83 is affixed to the slider 82, and retains the tube S13. One end of the spring 84 is connected to the slider 82, and the other end of the spring 84 is connected to the side wall 13 of the housing 31. The spring 84 can provide a pulling force to the slider 82.

As shown in FIG. 2 and FIG. 3, when the removable device 30 is moved from the detachable location in FIG. 3 to the mounting location in FIG. 2, the tube S13 drives the slider 82 of the sliding mechanism 80 to a storage location. Moreover, the spring 84 can pull the slider 82 to the storage location. As shown in FIG. 2, in the storage location, the flexible tube 70 is bent in the plane, and limits the bending of the two curved sections S131 of the tube S13 to the same plane. The blocking element 16 limits the flexible tube 70 and the curved section S131 of the tube S13 to the access area. The blocking element 16 limits the flexible tube 70 and the curved section S131 of the tube S13 to the access area.

As shown in FIG. 2 and FIG. 3, when the removable device 30 is moved from the mounting location in FIG. 2 to the detachable location in FIG. 3, the tube S13 drives the slider 82 of the sliding mechanism 80 to an extension location. Moreover, the storage location is closer to blocking element 16 than the extension location. As shown in FIG. 3, in the extension location, the degree of bending of the flexible tube 70 is smaller than the degree of bending of the slider 82 when it is in the storage location of FIG. 2.

Therefore, in the embodiment, the sliding mechanism 80 and the flexible tube 70 can be used to organize the curved sections S131 of the tube S13 to prevent the curved sections S131 of the tube S13 from being entangled or bent in an improper way and causing damage to the tube S13.

The present disclosure can improve the convenience of repairing the cooling system by installing the components of the cooling system, such as pumps and tanks, into the removable device. Moreover, the present disclosure can replace a fan device in an existing chassis with a removable device, so the design cost of the cooling system can be reduced, and components such as pump and tank do not occupy the space of the main board in the chassis. Furthermore, the present disclosure uses the sliding mechanism and the flexible tube to prevent damage caused by tube entanglement or improper bending when the removable device is installed or removed.

Many details are often found in the relevant art, thus many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will, therefore, be appreciated that the embodiments described above may be modified within the scope of the claims.

What is claimed is:

1. An electronic apparatus, comprising:
   a chassis comprising a mounting slot;
   a heat exchanger disposed in the chassis;
   a removable device disposed in the mounting slot, and comprising a housing and a first pump disposed in the housing;
   a tube connected to the heat exchanger and the first pump; and
   a sliding mechanism disposed in the chassis, and connected to the tube,
   wherein when the removable device is moved to a mounting location, the tube drives the sliding mechanism to a storage location, and
   when the removable device is moved to a detachable location, the tube drives the sliding mechanism to an extension location closer to the mounting slot than the storage location.

2. The electronic apparatus as claimed in claim 1, wherein the sliding mechanism is adjacent to the mounting slot than, and comprising:
   a track disposed on a side wall of the chassis;
   a slider movably disposed on the track; and
   a strap affixed to the slider, and attached to the tube.

3. The electronic apparatus as claimed in claim 2, wherein the sliding mechanism further comprises a spring connected to the slider and the side wall.

4. The electronic apparatus as claimed in claim 1, further comprising a flexible tube covers a curved section of the tube.

5. The electronic apparatus as claimed in claim 4, wherein the removable device is moveably in the mounting slot along a movement direction, the flexible tube comprises a plurality of connection elements, each of the connection elements is pivoted on one of the connection elements, each of the connection elements are rotated in a plane containing the movement direction.

6. The electronic apparatus as claimed in claim 4, wherein the chassis further comprises a blocking element adjacent to the flexible tube, and the flexible tube is between the blocking element and the removable device, wherein the storage location is closer to the blocking element than the extension location, and the mounting location is closer to the blocking element than the detachable location.

7. The electronic apparatus as claimed in claim 1, wherein the removable device further comprises a tank disposed on the first pump, and connected to the tube, the tank is configured to store cooling liquid, wherein when the first pump is operating, the cooling liquid flows into the tank.

8. The electronic apparatus as claimed in claim 7, wherein the removable device further comprises a sensor disposed on the tank, wherein the sensor is configured to detect a height of the cooling liquid in the tank.

9. The electronic apparatus as claimed in claim 7, wherein the removable device further comprises an input joint disposed on an outer wall of the housing, and connected to the tank.

10. The electronic apparatus as claimed in claim 1, wherein the removable device further comprises a second pump connected to the first pump and the tube, and the first pump is connected to the tube via the second pump.

11. The electronic apparatus as claimed in claim 1, further comprising a plurality of fan devices, the chassis further comprising a plurality of fan slots, the fan device is detachably disposed in the fan slot, wherein the mounting slot and the fan slot are arranged in an arrangement direction, and the heat exchanger is adjacent to the fan device.

12. The electronic apparatus as claimed in claim 1, further comprising:
   a heat source disposed in the chassis; and
   a cooling element disposed on the heart source, and connected to the tube.

* * * * *